United States Patent [19]
Noumi et al.

[11] Patent Number: 5,915,172
[45] Date of Patent: Jun. 22, 1999

[54] METHOD FOR MANUFACTURING LCD AND TFT

[75] Inventors: Shigeaki Noumi; Kazuhiko Noguchi; Takeshi Kubota; Masami Hayashi; Takeshi Morita, all of Tokyo, Japan

[73] Assignee: Mitsubishi Denki Kabushiki Kaisha, Tokyo, Japan

[21] Appl. No.: 08/889,322

[22] Filed: Jul. 8, 1997

[30] Foreign Application Priority Data

Dec. 26, 1996 [JP] Japan ........................ 8-348836

[51] Int. Cl.$^6$ ........................................ H01L 21/00
[52] U.S. Cl. ........................ 438/151; 438/165; 438/587
[58] Field of Search ........................ 438/151, 165, 438/587, 690, 691, 937

[56] References Cited

U.S. PATENT DOCUMENTS 5,530,265  6/1996  Takemura .

FOREIGN PATENT DOCUMENTS

| | | |
|---|---|---|
| 1-110749 | 4/1989 | Japan . |
| 3-291971 | 12/1991 | Japan . |
| 4-183897 | 6/1992 | Japan . |
| 4-217378 | 8/1992 | Japan . |
| 5-61068 | 3/1993 | Japan . |
| 5-67784 | 3/1993 | Japan . |
| 5-323304 | 12/1993 | Japan . |
| 6-104282 | 4/1994 | Japan . |
| 6-112488 | 4/1994 | Japan . |
| 6-268218 | 9/1994 | Japan . |
| 6-336694 | 12/1994 | Japan . |
| 8-120489 | 5/1996 | Japan . |

*Primary Examiner*—Charles Bowers
*Assistant Examiner*—Scott J. Hawranek
*Attorney, Agent, or Firm*—Oblon, Spivak, McClelland, Maier & Neustadt, P.C.

[57] ABSTRACT

Method for manufacturing TFTs including steps of forming a control electrode and control electrode line on a substrate, forming insulating film on the control electrode and the control electrode line, cleaning the substrate with the insulating film formed by a chemical or physical means, forming oxide film on the surface of the control electrode and control electrode line exposed by a film lacking portion generated in the insulating film after cleaning, forming a semiconductor layer via the insulating film on the control electrode, and forming a pair of electrodes constituting a semiconductor element together with the semiconductor layer.

10 Claims, 6 Drawing Sheets

CLEANING BY BRUSH   PHYSICAL OR CHEMICAL CLEANING

PLASMA OXIDATION, ANODIC OXIDATION OR HIGH PURITY WATER BOILING

ANODIC OXIDATION PROCESS ↓ PLASMA OXIDATION, HIGH PURITY WATER BOILING OR INSULATING FILM

METHOD FOR MANUFACTURING LCD AND TFT

BACKGROUND OF THE INVENTION

The present invention relates to a method for manufacturing, for example, active matrix type liquid crystal display and thin-film transistors (hereinafter called "TFT") to be used for these devices.

FIG. 4 shows a cross-sectional drawing showing a process for manufacturing conventional TFT array substrates with TFT of the TFT type liquid crystal display in which low-resistivity bus lines are provided. In the drawing, numeral 1 denotes a transparent insulating substrate such as glass substrate, etc., 2 a gate electrode formed on the transparent insulating substrate 1, 3 a gate line formed on the transparent insulating substrate 1, 4 a gate insulating film formed on the gate electrode 2 and the gate line 3, 8 a semiconductor layer formed on the gate electrode 2 via the gate insulating film 4, 9 an ohmic contact layer formed on the semiconductor layer 8, 10 a pixel electrode, 11 a hole for connecting with a terminal, formed on the gate insulating film 4 on the gate line 3, 12 a source-drain electrode formed on the ohmic contact layer 9, 13 a channel, and 14 a passivation film.

Next description will be made on the process for manufacturing the conventional TFT array substrate on which TFTs are provided. As shown in FIG. 4(a), after forming a single-layer film made of a low resistivity metal such as Al or Al alloy, etc. on the surface of the transparent insulating substrate 1, patterning is carried out using a photoresist formed by photolithography process, and the gate electrode 2 and gate line 3 are formed. Then, as shown in FIG. 4(b), silicon nitride is formed to be a film by plasma enhanced CVD method and the gate insulating film 4 is formed. Then, as shown in FIG. 4(c), after continuously forming amorphous silicon film by plasma enhanced CVD method and n$^+$type amorphous silicon film which is doped with impurities, using a photoresist formed by photolithography process, the amorphous silicon film and n$^+$type amorphous silicon film are simultaneously patterned, and the semiconductor layer 8 and ohmic contact layer 9 are formed at the position above the gate electrode.

Then, as shown in FIG. 4(d), after ITO (indium tin oxide) film is formed as a transparent conductive film, using a photoresist formed by photolithography process, the ITO film is patterned to form the pixel electrode 10. Then, as shown in FIG. 4(e), the gate insulating film 4 on the gate line 3 is removed by etching, and a hole 11 for providing the terminal is formed. Then, as shown in FIG. 4(f), after forming Cr, etc. to be a film, using a photoresist formed by photolithography process, the film is patterned and the source-drain electrode 12 and the source signal conductor are formed on the ohmic contact layer 9. This is followed by removal of the n$^+$type amorphous silicon film (ohmic contact layer 9) of the portion not covered with the source drain electrode 12 by dry etching to form the channel 13, and then, the photoresist is removed. Lastly, as shown in FIG. 4(g), silicon nitride is formed to be a film and passivation film 14 is formed.

As described above, with the conventional TFT array substrate, the gate electrode 2 and gate line 3 are formed with the film primarily comprising metals with low resistivity, such as Al, etc. but because these metals provide poor chemical resistance, an etchant used for patterning the ITO film composing the pixel electrode 10 penetrates through the portion lacking of film in the gate insulating film 4 and corrodes the gate electrode 2 and the gate line 3, raising problems of lowering the yield and reliability of TFT.

Hitherto, for a method to prevent corrosion of conductors composing the gate electrode 2 and gate line 3 caused by the etchant attacking the ITO film, a method to perform an anodic oxidation of conductors of Al film, etc. composing the gate electrode 2 and gate line 3 to form oxide film on their surfaces has been proposed.

For example, in Japanese Unexamined Patent Publication No. 183897/1992, there is proposed a method for forming an anodic oxidation film 18 on the gate electrode 2 and gate line 3 other than the areas coated with photoresist 17 by forming the gate electrode 2 and gate line 3 by patterning after first forming single-layer film by metals with low resistivity such as Al or Al alloys on the surface of the transparent insulating substrate 1 as shown in FIG. 5(a), and anodic oxidation after forming the photoresist 17 for protecting the portion serving as a region for taking out terminals on the gate line 3 as shown in FIG. 5(b). Because with this method, the anodically oxidized film 18 is not formed in the region for providing terminals of the gate line 3, if terminals are connected with the gate line 3, the process for removing the anodic oxidation film in the region is not required.

In Japanese Unexamined Patent Publication Nos. 110749/1989, 217378/1992, and 323304/1993, first of all, a single-layer film is formed with metals with low resistivity such as Al or Al alloys, on the surface of the substrate 1a as shown in FIG. 6(a), then, the film is patterned to form the first conductive film 2a, and then, the first insulating film 4a is formed on the first conductive film 2a using insulation material or high-resistivity semiconductor material as shown in FIG. 6(b). In this event, as shown in FIG. 6(c), in the first insulating film 4a, film lacking portion 5a is generated. Then, there is proposed a method for forming an insulating film or oxide film 19 at a lacking portion 5a of a film by electrophoresis or anodic oxidation as shown in FIG. 6(d). With this method, it is possible to form the insulating film or the oxide film 19 selectively only on the lacking portion 5a of the film generated in the first insulating film 4a.

As described above, several methods have been hitherto proposed as a method for preventing penetration of the etchant used for patterning of ITO film composing the pixel electrode 10 in the conventional TFT type liquid crystal display in which low resistivity bus lines are provided and for preventing corrosion of the gate electrode 2 and gate line 3 formed by the material with low resistivity such as Al, etc. through the lacking portion, etc. in the gate insulating film 4, but any of them are not effective.

For example, in the method for forming the anodic oxidation film 18 on the surfaces by anodic oxidation after forming the gate electrode 2 and gate line 3, photoresist 17 must be formed to prevent the oxide film 18 from being formed on the area (area for taking out terminals) in contact with the upper layer via the insulating film, raising problems of reducing the productivity, etc.

Because in the method for forming the insulating film or oxide film 19 selectively only on the film lacking portion 5a in the first insulating film 4a after forming the first insulating film 4a on the first conductive film 2a, the insulating film or oxide film 19 are formed by electrophoresis, anodic oxidation process, or other methods without carrying out pretreatment after the first insulating film 4a is formed, the potential defective portion of the film such as dust taken into the first insulating film 4a is actualized, raising a problem of generating another film lacking portion.

This invention has been made to solve the problems as mentioned above, and it is object of the present invention to provide the provision of a process for manufacturing high-reliability thin-film transistors without lowering productivity and with enhanced yield by preventing corrosion of gate electrode and gate line resulting from the etchant attacking the ITO film composing the pixel electrode without forming any protective film by the photolithography process newly and disposing of the potential lacking portion of the film by actualizing the portion in advance.

It is another object of this invention to provide a liquid crystal display of a high aperture ratio by forming patterns with fine lines by composing the gate electrode and gate line by the use of material with low resistivity.

SUMMARY OF THE INVENTION

Method for manufacturing TFTs according to this invention comprising steps of forming a control electrode and control electrode line on a substrate, forming insulating film on the control electrode and the control electrode line, a process for cleaning the substrate with the insulating film formed by a chemical or physical means, forming oxide film on the surface of the control electrode and control electrode line exposed by a film lacking portion generated in the insulating film after cleaning, forming a semiconductor layer via the insulating film on the control electrode, and forming a pair of electrodes constituting a semiconductor element together with the semiconductor layer.

The surface layer of the control electrode and control electrode line is formed with the conductor with low resistivity.

The oxide film is formed by anodic oxidation.

In addition, in the anodic oxidation process, anodic oxidation is carried out with the anodic oxidation voltage or anodic oxidation current controlled.

Alternatively, in anodic oxidation process, the substrate coated with the film of the same metal as the material composing the control electrode and control electrode line or the plate of the same metal is connected in such a manner to achieve the same potential as that of the transparent insulating substrate with the control electrode, control electrode line, and insulating film formed, and simultaneously anodic oxidation the both is carried out.

Alternatively, in the anodic oxidation process, anodic oxidation is carried out while cooling the substrate with the control electrode, control electrode line, and insulating film formed.

Alternatively, the oxide film is formed by plasma oxidation treatment or demineralized water boiling treatment.

It includes a process for forming oxide film several nm thick on the control electrode and control electrode line after forming the control electrode and control electrode line.

The insulating film is formed at temperatures of 150° C. or lower.

In addition, the insulating film is silicon nitride film or silicon oxide film.

The liquid crystal display device according to this invention comprises a transparent insulating substrate, a TFT formed on the transparent insulating substrate by any one of the above-mentioned methods, a pixel electrode comprising a transparent conductive film connected to either one of a pair of the electrodes composing the thin-film transistor, and an opposed substrate with opposed electrodes, etc. for holding the liquid crystal material therebetween together with the transparent insulating substrate.

DETAILED DESCRIPTION

Embodiment 1

Figure 1A:
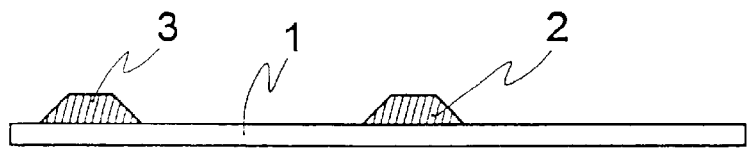
FIGS. 1(a) to 1(i) are each cross sectional view showing a producing steps of TFT in accordance with Embodiment 1 of the invention.

Referring now to drawings, there is shown a process for manufacturing TFT, one embodiment of this invention, and a liquid crystal display device manufactured by using the process. FIG. 1 is a cross-sectional drawing showing a process for manufacturing TFT array substrates on which TFTs are provided according to Embodiment 1 of this invention. In this drawing, numeral 1 is a substrate (transparent insulating substrate in this embodiment), 2 a gate electrode formed on the substrate 1, 3 a gate line functioning as a control electrode formed on the substrate 1, 4 a gate insulating film formed on the gate electrode 2 and gate line 3, 5a a film lacking portion in the gate insulating film 4 actualized after forming the gate insulating film 4, 5b a film lacking portion actualized by chemical or physical cleaning after forming the gate insulating film 4, 6 foreign matter such as dust, etc. included in the gate insulating film 4, 7 an oxide film formed on the film lacking portions 5a, 5b, 8 a semiconductor layer formed on the gate electrode 2 via the gate insulating film 4, 9 an ohmic contact layer formed on the semiconductor layer 8, 10 a pixel electrode, 11 a hole portion for taking out the terminal formed on the gate insulating film 4 on the gate line 3, 12 a source/drain electrode formed on the ohmic contact layer 9, 13 a channel, and 14 a passivation film.

Next, description will be made on the manufacturing method of TFT array substrates on which TFTs are providing according to this embodiment. First of all, as shown in FIG. 1 (a), metal film with low resistivity such as Al film containing 0.2 wt % of Cu (hereinafter stated as Al-0.2 wt % Cu) is formed about 250 nm thick on the surface of the transparent insulating substrate 1 by sputtering, etc., and then, patterning is carried out using a photoresist formed by the photolithography method to form the gate electrode 2 and gate line 3. In this event, for patterning the Al film, an etchant primarily composed of phosphoric acid, acetic acid, and nitric acid is used, but the coatability relating to the film formed on the top surface can be improved by forming the etched end surface of the Al film in the tapered profile by investigating the composition of phosphoric acid, acetic acid, and nitric acid in advance.

Figure 1B:
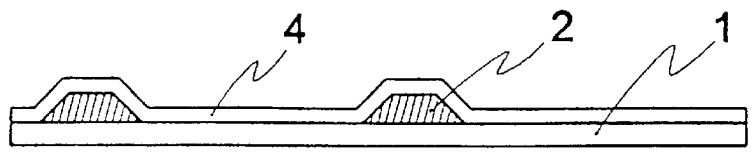
Figure 1C:
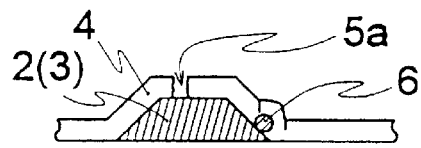

Next, as shown in FIG. 1(b), silicon nitride film or silicon oxide film which will serve as the gate insulating film 4 is formed about 450 nm thick by plasma enhanced CVD process, etc. In the gate insulating film 4 by the silicon nitride film or silicon oxide film formed in this way, the film lacking portion 5a attributable to adhesion of dust, etc. exists as shown in FIG. 1(c), and the film lacking portion 5a of this gate insulating film 4 allows the etchant used for patterning of the ITO film composing the pixel electrode 10 to penetrate, causing corrosion of the gate electrode 2 and the gate line 3 primarily composed of Al. In the gate insulating film 4, fine particle 6 such as dust, etc. exists potentially, and the fine particle 6 is peeled in the subsequent processes including brush cleaning, and a new film lacking portion 5b is actualized. This newly generated lacking portion 5b in the film serves to cause corrosion of the gate electrode 2 and the gate line 3 primarily composed of Al in the similar manner as in the case of the film lacking portion 5a.

Figure 1D:
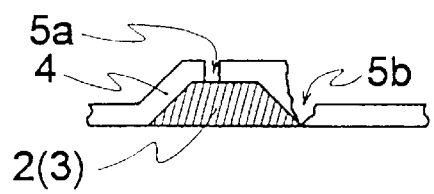
Figure 1E:
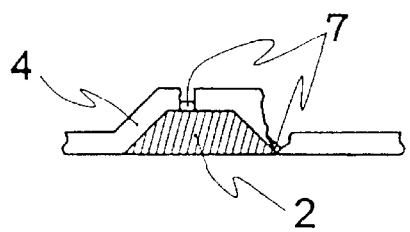

Therefore, in the next step, the surface of the gate insulating film 4 is brush-cleaned to remove fine particle 6 existing potentially in the gate insulating film 4, and the film lacking portion 5b is actualized as shown in FIG. 1(d). Then, as shown in FIG. 1(e), an oxide film 7 is formed by selectively subjecting anodic oxidation to the surfaces of the gate electrode 2 and the gate line 3 exposed by generation of the film lacking portions 5a and 5b.

Figure 1F:
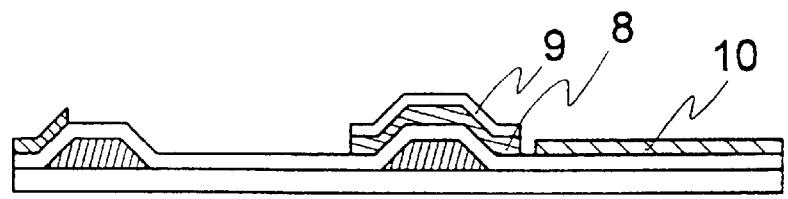
Figure 1G:
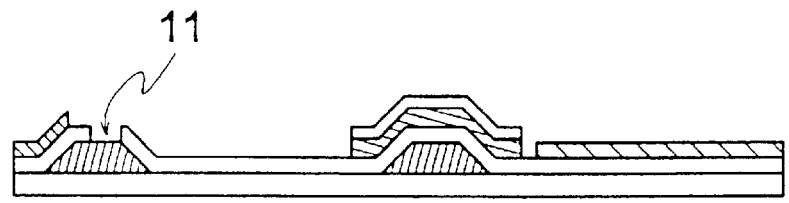

Next, as shown in FIG. 1(f), after successively forming amorphous silicon film about 120 nm thick by plasma enhanced CVD method, etc. and n$^+$type amorphous silicon film about 30 nm thick which is doped with impurities, using the photoresist formed by the photolithography process, the amorphous silicon film and n$^+$type amorphous silicon film are simultaneously patterned, and the semiconductor layer 8 and the ohmic contact layer 9 are formed on the position above the gate electrode 2. Then, the surface of the transparent insulating substrate 1 is brush-cleaned to remove adhering dust, etc.; then, the ITO film is formed about 100 nm thick by the sputtering method, etc. as a transparent conductive film; then, using the photoresist formed by the photolithography process, patterning is carried out to form the pixel electrode 10. Next, as shown in FIG. 1 (g), the gate insulating film 4 on the gate line 3 is removed by etching, and a hole (or a hole portion) 11 for providing terminals is formed.

Figure 1H:
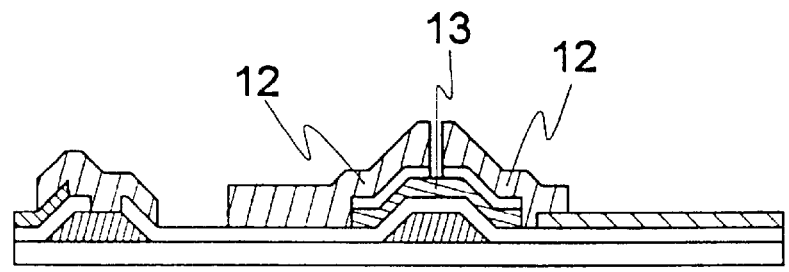
Figure 1I:
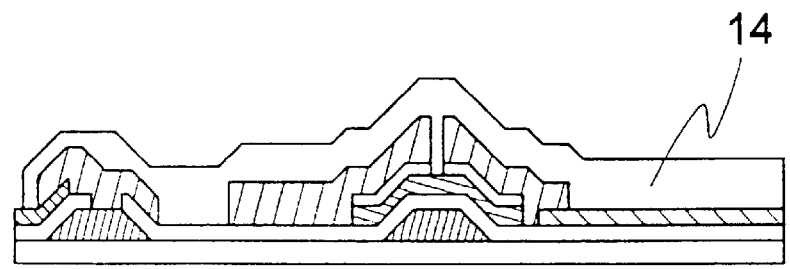

Next, as shown in FIG. 1(h), in order to form the source/drain electrode 12 and the source signal line (not illustrated), first of all, by the sputtering method, etc., in the lowermost layer, Cr film with good ohmic contact for n$^+$amorphous silicon film composing the ohmic contact layer 9, and for the ITO film composing the pixel electrode 20 is formed by about 100 nm thick, for the intermediate layer, the Al-0.2 wt % Cu film of about 300 nm thick with low resistivity is formed and for the uppermost layer, and continuously Cr film of about 50 nm thick for suppressing the cell reaction with the ITO film composing the pixel electrode 10, the cell reaction occurring in the alkali developer for forming a photoresist used for patterning is formed to be a three-layers film. Then, using the etching photoresist formed by the photolithography process, the three-layers film is successively patterned, and the source/drain electrode 12 and source signal conductor are formed on the ohmic contact layer 9. Successively, after the channel 13 is formed by etching n$^+$type amorphous silicon film (ohmic contact layer 9) of the portion not covered with the source/drain electrode 12 by dry etching method, the photoresist is removed. Lastly, as shown in FIG. 1 (i), silicon nitride film is formed about 500 nm thick by plasma enhanced CVD method, etc. to form a passivation film 14.

In the TFT array substrate formed in this way, the electrical contact characteristics with the upper surface through the hole 11 for providing the terminal above the gate line 3 is satisfactory, and no corrosion was observed in the gate electrode 2 and the gate line 3.

In this embodiment, in order to remove the fine particle 6 potentially existing in the gate insulating film 4 and to actualize the film lacking portion 5b, brush cleaning was carried out after forming the gate insulating film 4, but in place of brush cleaning, physical cleaning such as ion beam irradiation, ultrasonic cleaning in a solution, high-speed liquid injection, etc., or chemical cleaning such as immersion in hydrofluoric acid based etchant, organic based liquid immersion, UV irradiation, etc. may be used. Further, by combining some of the above mentioned cleaning methods, the foreign matter 6 existing potentially in the gate insulating film 4 can be removed more efficiently.

In this embodiment, oxide film 7 was formed on the surface of the gate electrode 2 and the gate line 3 exposed by generation of the film lacking portions 5a and 5b, but the oxide film 7 may be formed by plasma oxidation or demineralized water boiling treatment in place of anodic oxidation. If the oxide film 7 is formed by plasma oxidation or demineralized water boiling treatment, lines for electrically short-circuit-connecting each gate line 3 required for anodic oxidation is no longer needed, and the process for separating this lines in the subsequent process is no longer required, resulting in improved productivity.

It is possible to reduce the number of hillocks generated on the gate electrode 2 and gate line 3 and to improve the coatability of the gate insulating film 4 when silicon nitride film or silicon oxide film are formed, by carrying out plasma oxidation or demineralized water boiling treatment at 400 to 500° C. for 30 minutes to form an oxide film by several nanometer thick on the gate electrode 2 and gate line 3 before forming silicon nitride film or silicon oxide film composing the gate insulating film 4 after forming the gate electrode 2 and the gate line 3, achieving further greater effects to prevent corrosion of the gate electrode 2 and the gate line 3 by the etchant attacking the ITO film composing the pixel electrode 10.

In the anodic oxidation process for forming the oxide film 7 on the surface of the gate electrode 2 and the gate line 3 exposed by generation of the film lacking portions 5a and 5b, if the anodic oxidation voltage suddenly rises, a large current flows in the exposed portion of the gate electrode 2 and the gate line 3, and the gate electrode 2 and the gate line 3 are disconnected at the exposed portions due to excessive Joule heat generated thereon. In order to suppress generation of excessive Joule heat and prevent disconnection of the gate electrode 2 and the gate line 3, it is necessary to control the anodic oxidation voltage or anodic oxidation current.

Figure 2:
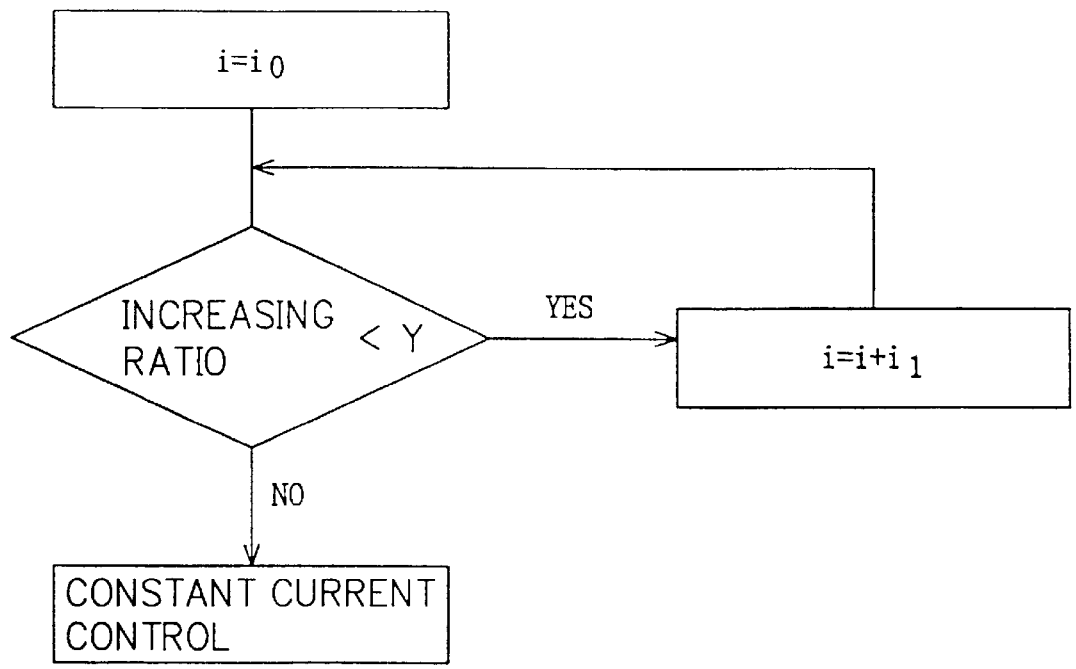
FIG. 2 is a flow chart showing the steps until constant current control is attained in the anodic oxidation process in accordance with the invention.

FIG. 2 is a flow chart showing a process for preventing sudden increase of anodic oxidation voltage. In the drawing, symbol $i_0$ denotes the initial current value, Y the maximum voltage increase ratio, $i_1$ an increment current value, and the anodic oxidation current is increased by the increment current value $i_1$ from the initial current value $i_0$, and constant current control is carried out when the voltage increase ratio at the time reaches the maximum voltage increase ratio Y. For example, when a quadrilateral substrate 300 mm wide by 400 mm long is anodized, it is possible to form the oxide film 7 on the surface of the gate electrode 2 and the gate line 3 exposed by the film lacking portions 5a and 5b by anodic oxidation without disconnecting the gate electrode 2 and the gate line 3 due to excessive Joule heat by setting the initial current value $i_0$ to about 5 pA, maximum voltage increase ratio Y to about 200 V/sec, and increment current value $i_1$ to about 5 pA.

It is also allowed to gradually increase the anodic oxidation voltage in place of anodic oxidation current until the desired anodic oxidation voltage value is reached. For example, when a quadrilateral substrate 300 mm wide by 400 mm long is anodized, disconnection of the gate electrode 2 and the gate line 3 can be prevented by suppressing the generation of excessive Joule heat by setting the current value to about 0.05 A, the initial voltage value to about 1 mV, and the increment voltage value to about 1 mV.

According to this invention, it is possible to prevent corrosion of the gate electrode 2 and the gate line 3 due to the etchant attacking the ITO film composing the pixel electrode 10 and to manufacture high-reliability thin-film transistors at a high yield without lowering the productivity by forming selectively the oxide film 7 by anodic oxidation, etc. only on the surfaces of the gate electrode 2 and the gate line 3 exposed by the film lacking portions 5a and 5b after actualizing the film lacking portion 5b existing potentially in the gate insulating film 4 by brush cleaning. Because in the anodic oxidation process, sudden rise of anodic oxidation voltage can be prevented by controlling the anodic oxidation voltage or anodic oxidation current, it is possible to suppress the generation of excessive Joule heat and prevent disconnection of the gate electrode 2 and the gate line 3.

Embodiment 2

Figure 3:
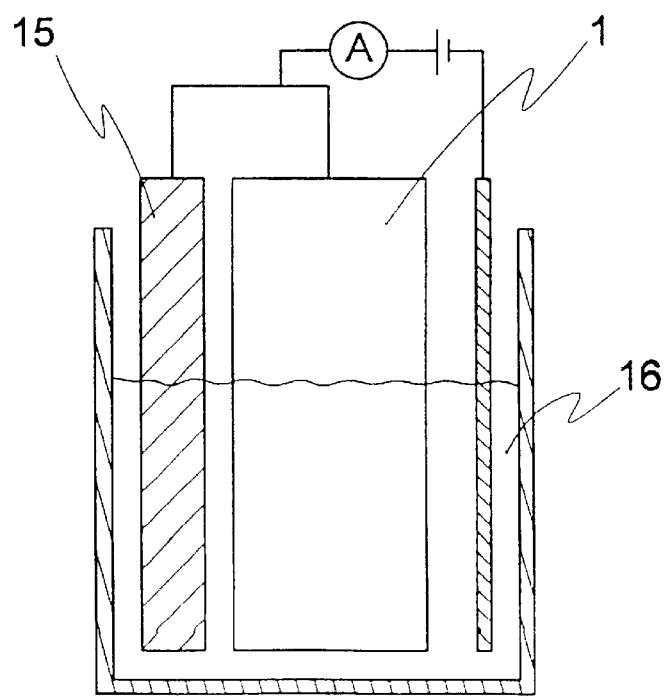
FIG. 3 is a schematic explanatory view showing an anodic oxidation process in accordance with Embodiment 2 of the invention.
Figure 4A:
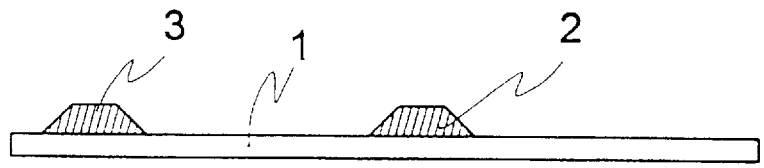
FIGS. 4(a) to 4(g) are each cross sectional view showing the producing steps of conventional TFT.
Figure 4B:
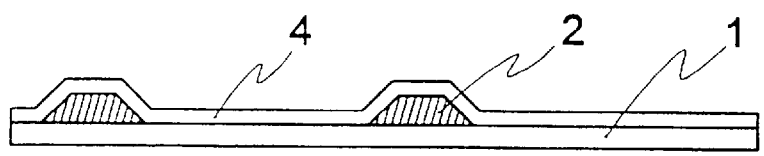
Figure 4C:
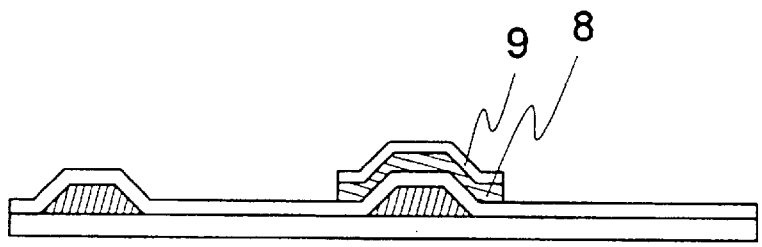
Figure 4D:
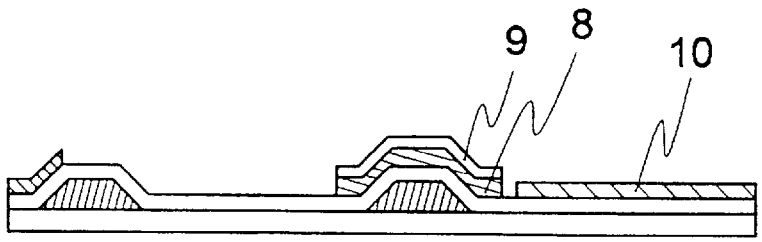
Figure 4E:
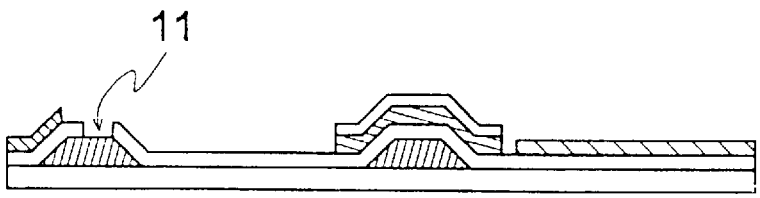
Figure 4F:
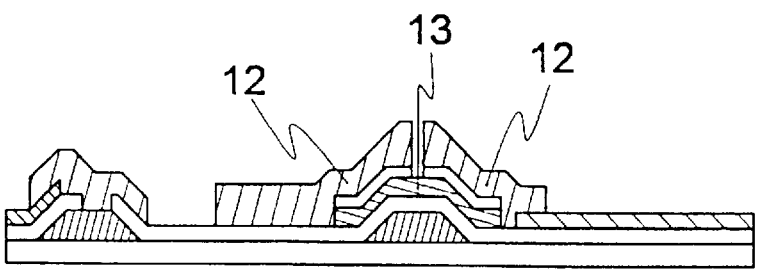
Figure 4G:
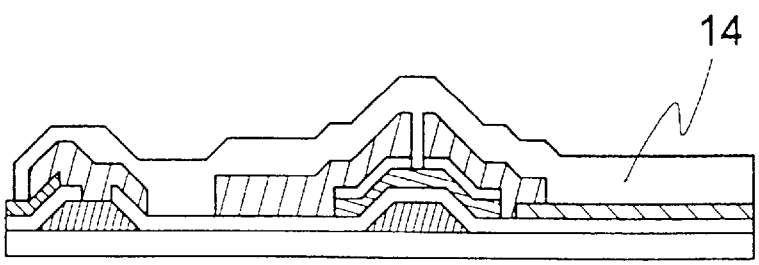
Figure 5A:
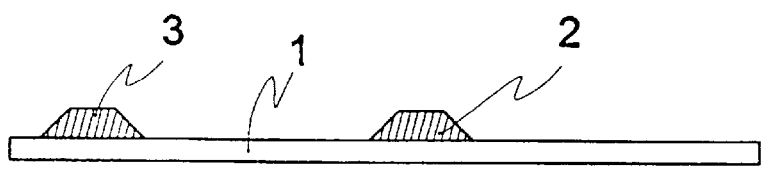
FIG. 5(a) and 5(b) are each cross sectional view showing the producing steps of another conventional TFT.
Figure 5B:
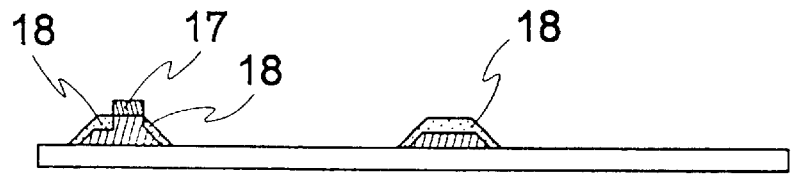
Figure 6A:
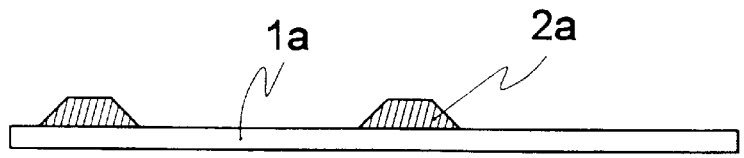
FIGS. 6(a) and 6(d) are each cross sectional view showing the producing steps of still another conventional TFT.
Figure 6B:
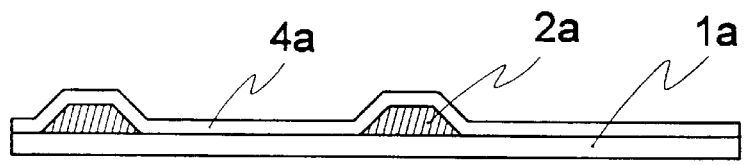
Figure 6C:
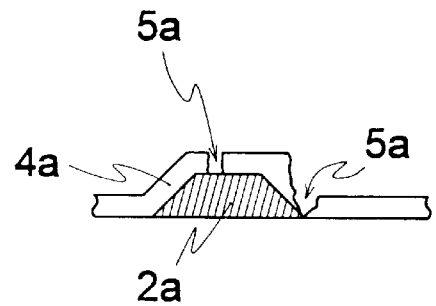
Figure 6D:
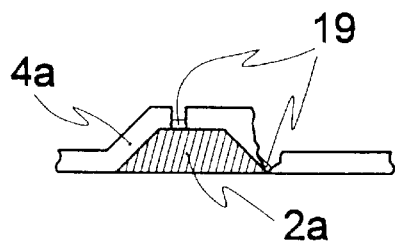

In Embodiment 1, sudden rise of anodic oxidation voltage was prevented by controlling the anodic oxidation voltage or anodic oxidation current in the anodic oxidation process, but as shown in FIG. 3, it is also possible to easily set the anodic oxidation current value by connecting the substrate coated with the film of the same metal as the material composing the gate electrode or a plate 15 of the same metal in such a manner to achieve the same potential as that of the gate electrode, gate line, and transparent insulating substrate 1 with the gate insulating film formed in the anodic oxidation process, and it is thereby possible to prevent a sudden rise of the anodic oxidation voltage and to prevent disconnection of the gate electrode and the gate line due to the generation of excessive Joule heat.

In FIG. 3, numeral 15 is a substrate coated with the film of the same metal as the material composing the gate electrode or a metal plate formed with the same metal (hereinafter called a "metal substrate") and 16 an anodic oxidation solution, and on the transparent insulating substrate 1, a gate electrode, gate line, and gate insulating film are formed. Because the anodic oxidation current value depends on the area of the metal portion of the metal substrate 15 which is connected in such a manner as to achieve the same electrical potential as that of the transparent insulating substrate 1 and is anodized simultaneously, it is possible to easily set the anodic oxidation current value by varying this area. For example, the metal portion of the metal substrate 15 has a size about ⅓ of the area of the transparent insulating substrate 1 and is a metal film formed in the thickness exceeding the film thickness of the gate electrode or gate line or is a metal foil or metal plate with thickness exceeding the film thickness of the gate electrode or gate line. The anodic oxidation current is about 0.2 A if the size of the metal substrate 15 is assumed to be a quadrilateral 100 mm wide by 400 mm long, and it becomes possible to prevent flowing a current large enough to disconnect the gate electrode and gate line resulting from the Joule heat generated.

According to this embodiment, because the anodic oxidation current value can be set by the area of the metal portion of the metal substrate 15 by connecting the metal plate 15 coated with the film of the same metal as the material composing the gate electrode or a metal plate 15 made of the same metal in such a manner to achieve the same potential as that of the transparent insulating substrate 1 with the gate electrode, gate line, and gate insulating film formed in the anodic oxidation process and simultaneously anodic oxidation the both, it is possible to prevent a sudden rise of the anodic oxidation voltage and to prevent disconnection of the gate electrode and the gate line resulting from the generation of excessive Joule heat.

Embodiment 3

In Embodiment 1, a sudden rise of the anodic oxidation voltage was prevented by controlling the anodic oxidation voltage or anodic oxidation current in the anodic oxidation process and disconnection of the gate electrode 2 and the gate line 3 resulting from generation of excessive Joule heat was prevented, but it is also possible to suppress the temperature rise of the transparent insulating substrate 1 under anodic oxidation treatment and to prevent disconnection of the gate electrode 2 and the gate line 3 resulting from the excessive Joule heat by anodic oxidation the transparent insulating substrate 1 while cooling the transparent insulating substrate.

For cooling methods, for example, temperature of the anodic oxidation solution is held to be within around 2° C. Alternatively if the anodic oxidation vessel is a rectangular parallelepiped with three sides 125 mm, 420 mm, and 500 mm long, respectively, the anodic oxidation solution at around 2° C. is circulated at the rate of 50 L/min or more. Alternatively a method for mounting a cold insulator in the same size as that of the transparent insulating substrate 1 under anodic oxidation treatment to its rear side is available.

According to this embodiment, because the temperature rise of the transparent insulating substrate 1 under anodic oxidation treatment can be suppressed by cooling the transparent insulating substrate 1 under the anodic oxidation treatment, it is possible to prevent disconnection of the gate electrode 2 and the gate line 3 resulting from the excessive Joule heat.

Embodiment 4

A liquid crystal panel is formed by allowing a TFT array substrate on which TFTs are formed in the same manner as in the cases of Embodiments 1, 2, and 3 to stand against a facing substrate with a black matrix, overcoat layer, and counter electrode formed on the other transparent insulating substrate after forming the alignment film on the surface, injecting liquid crystal into the clearance between these substrates, sealing them with a sealant, and at the same time, arranging a polarizer on the outside of the facing TFT array substrate and the facing substrate.

According to the embodiment, it is possible to obtain a liquid crystal display with a high aperture ratio by refining the size of the gate electrode 2 and gate line 3 and with improved irregularities in displaying caused by cross talk, by composing the gate electrode 2 and the gate line 3 with the material of low resistivity and at the same time forming the oxide film 7 selectively on the film lacking portions 5a, 5b generated in the gate insulating film 4.

According to the invention, it is possible to prevent corrosion of the gate electrode and the gate line resulting from the etchant attacking the ITO film composing the pixel electrode by forming the oxide film selectively only on the surface of the gate electrode and the gate line exposed by the film lacking portion of the gate insulating film after actualizing the film lacking portions existing potentially in the gate insulating film by chemical or physical cleaning and to thereby manufacture high-reliability thin-film transistors at high yield without reducing the productivity.

It is possible to obtain a liquid crystal display with a high aperture ratio achieved by refining the size of the gate electrode and the gate line and with improved irregularities in displaying caused by cross talk, by composing the gate electrode and the gate line with material with low resistivity and at the same time improving the coatability of the gate insulating films.

Though several embodiments of the present invention are described above, it is to be understood that the present invention is not limited only to the above-mentioned, various changes and modifications may be made in the invention without departing from the spirit and scope thereof.

What is claimed is:

1. Method for manufacturing TFTs comprising steps of
    forming a control electrode and control electrode line on a substrate,
    forming insulating film on the control electrode and the control electrode line,
    cleaning the substrate with the insulating film formed by a chemical or physical means,
    forming oxide film on the surface of the control electrode and control electrode line exposed by a film lacking portion generated in the insulating film after cleaning,
    forming a semiconductor layer via the insulating film on the control electrode, and
    forming a pair of electrodes constituting a semiconductor element together with the semiconductor layer.

2. The method of claim 1, wherein the surface layer of the control electrode and control electrode line is formed with the conductor with low resistivity.

3. The method of claim 1, wherein the oxide film is formed by anodic oxidation process.

4. The method of claim 3, wherein the anodic oxidation process is performed by controlling either of an anodic oxidation voltage and an anodic oxidation current.

5. The method of claim 3, wherein in anodic oxidation process, the substrate coated with the film of the same metal as the material composing the control electrode and control electrode line or the plate of the same metal is connected in such a manner to achieve the same potential as that of the transparent insulating substrate with the control electrode, control electrode line, and insulating film formed, and simultaneously anodic oxidation the both is carried out.

6. The method of claim 3, wherein the anodic oxidation process, anodic oxidation is carried out while cooling the substrate with the control electrode, control electrode line, and insulating film formed.

7. The method of claim 1, wherein the oxide film is formed by plasma oxidation treatment or demineralized water boiling treatment.

8. The method of claim 1, further including a step of forming oxide film several nm thick on the control electrode and control electrode line after forming the control electrode and control electrode line.

9. The method of claim 1, wherein the insulation film is formed at temperatures of 150° C. or lower.

10. The method of claim 1, wherein the insulating film is silicon nitride film or silicon oxide film.

* * * * *